US011552093B2

(12) United States Patent
Wang

(10) Patent No.: US 11,552,093 B2
(45) Date of Patent: Jan. 10, 2023

(54) 3D NAND FLASH MEMORY DEVICE

(71) Applicant: Powerchip Semiconductor Manufacturing Corporation, Hsinchu (TW)

(72) Inventor: Zih-Song Wang, Nantou County (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 145 days.

(21) Appl. No.: 16/952,078

(22) Filed: Nov. 19, 2020

(65) Prior Publication Data

US 2022/0108993 A1    Apr. 7, 2022

(30) Foreign Application Priority Data

Oct. 17, 2020    (TW) .................................. 109134727

(51) Int. Cl.
*H01L 27/1157*     (2017.01)
*H01L 27/11582*    (2017.01)
*H01L 29/78*       (2006.01)

(52) U.S. Cl.
CPC .... *H01L 27/1157* (2013.01); *H01L 27/11582* (2013.01); *H01L 29/7839* (2013.01)

(58) Field of Classification Search
CPC ............. H01L 27/1052; H01L 27/1085; H01L 27/10855; H01L 27/1128; H01L 27/11507; H01L 27/1157; H01L 27/1159; H01L 27/11521; H01L 29/40117; H01L 29/40114; H01L 29/66833; H01L 27/11524; H01L 27/11529; H01L 27/11582; H01L 29/7839; H01L 27/11556; H01L 27/11578; H01L 27/11565;

(Continued)

(56) References Cited

U.S. PATENT DOCUMENTS 8,183,617 B2 *   5/2012   Hsiao .................. H01L 29/4234
                                                       257/314
10,748,629 B2    8/2020   Harari
(Continued)

FOREIGN PATENT DOCUMENTS

CN       110268523       9/2019
TW       201114021       4/2011

OTHER PUBLICATIONS

Office Action of Taiwan Counterpart Application, dated Feb. 4, 2021, pp. 1-8.

*Primary Examiner* — Natalia A Gondarenko
(74) *Attorney, Agent, or Firm* — JCIPRNET

(57) ABSTRACT

A 3D NAND flash memory device includes a substrate, a source line on the substrate, a stacked structure on the source line, a bit line on the stacked structure, and a columnar channel portion. The stacked structure includes a first select transistor, memory cells, and a second select transistor, wherein the first select transistor includes a first select gate, the memory cells include control gates, and the second select transistor includes a second select gate. The columnar channel portion is extended axially from the source line and penetrates the stacked structure to be coupled to the bit line. The first select transistor includes a modified Schottky barrier (MSB) transistor to generate direct tunneling of majority carriers to the columnar channel portion to perform a program operation or an erase operation.

13 Claims, 6 Drawing Sheets

(58) Field of Classification Search
CPC ............. H01L 29/8124; H01L 29/7926; H01L 2924/13052; H01L 2924/1306; H01L 2924/1438; H01L 23/481; H01L 23/485; H01L 23/4855; H01L 23/522–53295; H01L 23/5384; G11C 16/0466; G11C 16/0408; G11C 16/0483; G11C 16/08; G11C 16/14

USPC ........ 257/326, 329, 368, E29.262, 314–316, 257/21.04

See application file for complete search history.

(56) References Cited

U.S. PATENT DOCUMENTS

| | | | |
|---|---|---|---|
| 2012/0327714 A1 | 12/2012 | Lue | |
| 2013/0089974 A1* | 4/2013 | Lee | H01L 27/11556 438/510 |
| 2015/0097222 A1* | 4/2015 | Lee | H01L 27/1157 257/314 |
| 2017/0373075 A1* | 12/2017 | Simsek-Ege | H01L 27/11582 |
| 2019/0043875 A1* | 2/2019 | Parat | G11C 16/0483 |
| 2019/0295956 A1 | 9/2019 | Kawai et al. | |
| 2021/0143285 A1* | 5/2021 | Lee | G11C 7/18 |

* cited by examiner

3D NAND FLASH MEMORY DEVICE

CROSS-REFERENCE TO RELATED APPLICATION

This application claims the priority benefit of Taiwan application serial no. 109134727, filed on Oct. 7, 2020. The entirety of the above-mentioned patent application is hereby incorporated by reference herein and made a part of this specification.

BACKGROUND OF THE INVENTION

Field of the Invention

The invention relates to a NAND flash memory, and particularly relates to a 3D NAND flash memory device.

Description of Related Art

Since a non-volatile memory device has the advantage of retaining stored data even in a power failure, the non-volatile memory device has become a widely adopted memory device in personal computers and electronic equipment. The flash memory array more commonly used by current industries includes a NOR-type array structure and a NAND-type array structure. Since in the non-volatile memory structure of an NAND-type array, memory cells are connected together in series, the degree of integration and area utilization thereof are better, and therefore the NAND-type array is widely used in a variety of electronic products.

Moreover, for the development of device miniaturization, the current mainstream of 3D NAND flash memory is to design the drive circuit under the NAND array. However, since 3D NAND flash memory in the form of CuA (Circuit under Array) is usually operated in gate-induced drain leakage (GIDL) mode, there is the issue of poor erase speed, and GIDL operation is greatly affected by temperature, so currently improvement is mostly made by increasing the drain terminal or substrate doping concentration. However, once the concentration is increased, junction breakdown occurs more easily. Moreover, as the number of stacked layers of 3D NAND flash memory is increased, the height of the channel is also increased. Therefore, the amount of electron holes injected into the channel during GIDL erase is inconsistent due to the distance from the source terminal, thus causing the issue that the same NAND string has different erase speeds.

SUMMARY OF THE INVENTION

The invention provides a 3D NAND flash memory device having the characteristics of no temperature dependence, fast erase speed, and consistency, and may be used in the layout design of a CuA architecture.

The 3D NAND flash memory device of the invention includes a substrate, a source line formed on the substrate, a stacked structure formed on the source line, a bit line, and at least one columnar channel portion. The stacked structure includes a first select transistor, a plurality of memory cells, and a second select transistor, wherein the first select transistor includes a first select gate, the plurality of memory cells include a plurality of control gates, and the second select transistor includes a second select gate. The bit line is formed on the stacked structure, and the columnar channel portion is extended axially from the source line and penetrates the stacked structure to be coupled to the bit line. The first select transistor includes a modified Schottky barrier (MSB) transistor to generate direct tunneling of majority carriers to the columnar channel portion to perform a program operation or an erase operation.

In an embodiment of the invention, the 3D NAND flash memory device may further include a drive circuit located on the substrate under the stacked structure.

In an embodiment of the invention, the first select transistor is a source-side select transistor, the source-side select transistor may further include a first metal silicide layer and a first type heavily doped region, and the first metal silicide layer is formed between the source line and the first select gate and isolated from the first select gate by an insulating layer. The first type heavily doped region is formed between the first metal silicide layer and the columnar channel portion and directly in contact with the first metal silicide layer and the columnar channel portion.

In an embodiment of the invention, a material of the first select gate and a material of the second select gate include a metal.

In an embodiment of the invention, a material of the control gate includes polysilicon.

In an embodiment of the invention, a material of the columnar channel portion includes n-doped polysilicon, p-doped polysilicon, or non-doped polysilicon.

In an embodiment of the invention, the columnar channel portion is a solid pillar or a hollow pillar.

In an embodiment of the invention, the hollow pillar may further include an insulating pillar.

In an embodiment of the invention, the first select transistor is a drain-side select transistor, the drain-side select transistor may further include a first metal silicide layer and a first type heavily doped region, and the first metal silicide layer is formed between the bit line and the first select gate and isolated from the first select gate by an insulating layer. The first type heavily doped region is formed between the first metal silicide layer and the columnar channel portion and directly in contact with the first metal silicide layer and the columnar channel portion.

In an embodiment of the invention, a material of the first metal silicide layer includes nickel silicide, cobalt silicide, or titanium silicide.

In an embodiment of the invention, the first type heavily doped region includes an n+ doped region or a p+ doped region.

Based on the above, in the invention, according to the structural design, an ohmic contact is formed at the source terminal or the drain terminal of the 3D NAND flash memory device using a modified Schottky barrier (MSB) transistor. Therefore, a program operation or an erase operation may be performed through direct tunneling of majority carriers. Therefore, the structure of the invention is not only suitable for the CuA design in which the drive circuit is placed under the NAND array, but may also solve the shortcomings of complicated gate-induced drain leakage (GIDL) erase methods, inconsistent speed of different pages, high temperature dependence, and frequent occurrence of junction breakdown.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
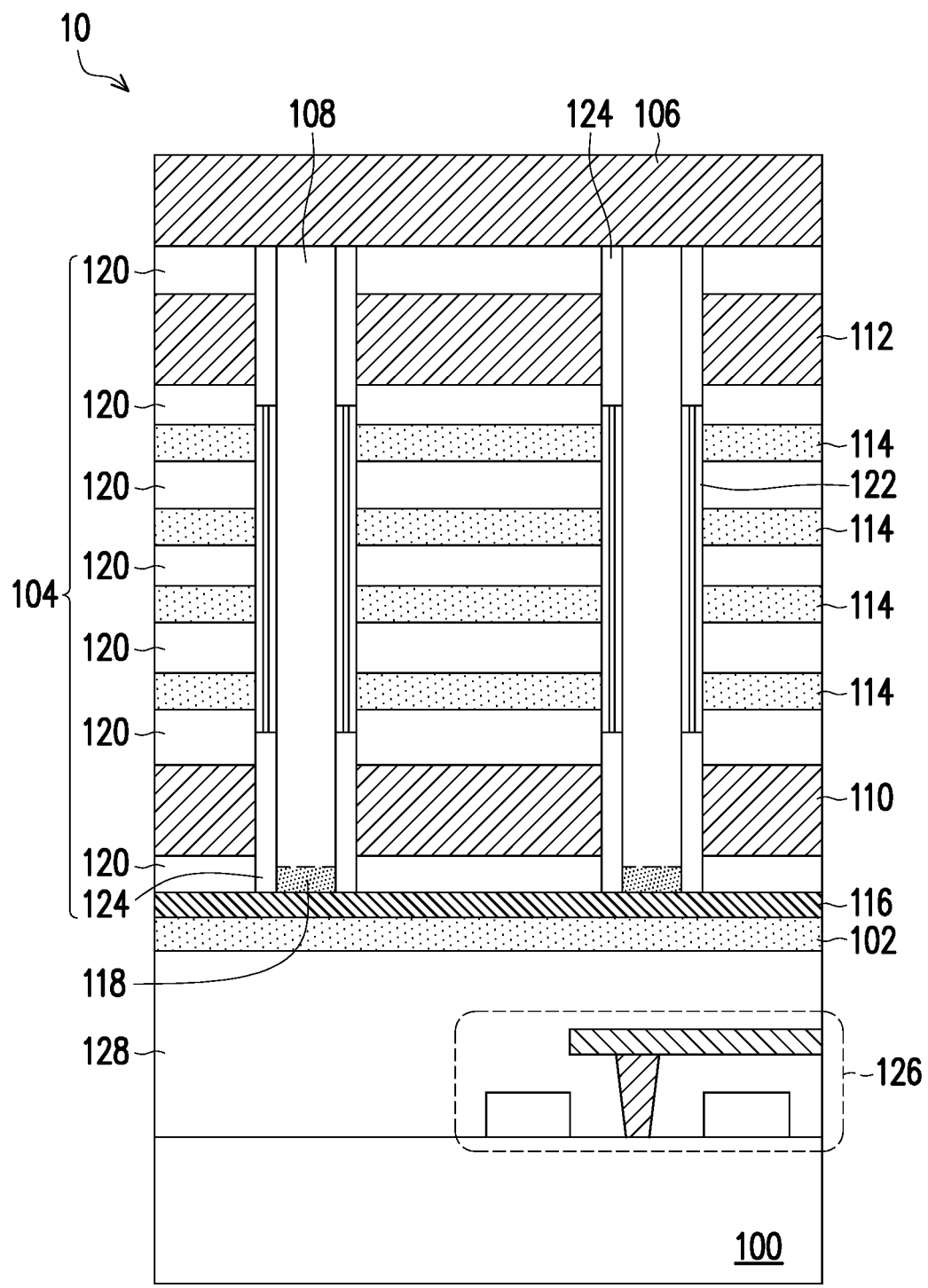
FIG. 1A is a diagram of a 3D NAND flash memory device according to the first embodiment of the invention.

FIG. 1A is a diagram of a 3D NAND flash memory device according to the first embodiment of the invention.

Referring to FIG. 1A, a 3D NAND flash memory device 10 of the first embodiment basically includes a substrate 100, a source line 102 formed on the substrate 100, a stacked structure 104 formed on the source line 102, a bit line 106 formed on the stacked structure 104, and at least one columnar channel portion 108. In the first embodiment, the stacked structure 104 includes a first select transistor, a plurality of memory cells, and a second select transistor, wherein the first select transistor includes a first select gate 110, and the second select transistor includes a second select gate 112. The plurality of memory cells include a plurality of control gates 114. In an embodiment, the material of the first select gate 110 and the material of the second select gate 112 include a metal, such as tungsten. Although FIG. 1A shows four layers of the control gates 114, it should be understood that the number of layers of the control gates 114 may be increased or decreased as needed, and the number of layers may be 10 or more, 20 or more, 30 or more, or 40 or more, etc. The material of the control gates 114 is polysilicon, for example. In the present embodiment, the first select transistor is a source-side select transistor, which is a modified Schottky barrier transistor with a dopant segregated layer and contains the first select gate 110, a first metal silicide layer 116, and a first type heavily doped region (such as a p+ doped region) 118. The first type heavily doped region 118 is disposed between the columnar channel portion 108 and the first metal silicide layer 116, wherein the material of the first metal silicide layer 116 is nickel silicide (NiSi$_x$), cobalt silicide (CoSi$_x$), titanium silicide (TiSi$_x$), etc. The plurality of control gates 114 are located on the first select gate 110, the second select gate 112 is located on the plurality of control gates 114, and an insulating layer 120 is disposed between all of the gates (110, 114, 112). The bit line 106 is formed on the second select gate 112 of the stacked structure 104.

Figure 1B:
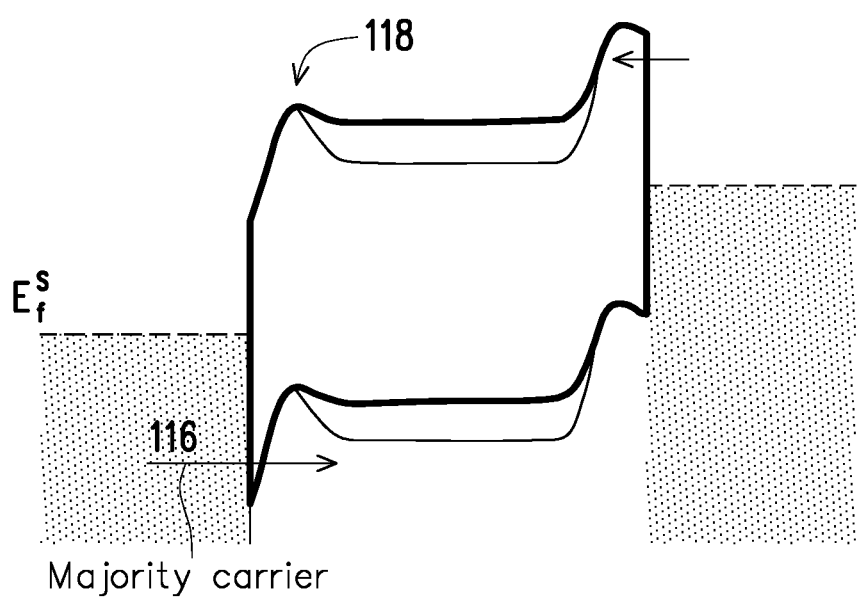
FIG. 1B is a diagram of conduction band and valence band waveforms of the MSB transistor of the 3D NAND flash memory device of the first embodiment performing an erase operation.

Referring further to FIG. 1A, the columnar channel portion 108 is extended axially from the source line 102 and penetrates the stacked structure 104 to be coupled to the bit line 106. The material of the columnar channel portion 108 is, for example, n-doped polysilicon, p-doped polysilicon, or non-doped polysilicon. The plurality of memory cells may further include a charge trapping layer 122 formed between the control gates 114 and the columnar channel portion 108 and surrounding the columnar channel portion 108, wherein the charge trapping layer 122 includes, for example, a silicon oxide layer, a silicon nitride layer, a composite layer of silicon oxide layer (ONO layer), or other suitable structural layers. Since the source-side select transistor has the first metal silicide layer 116 and the first type heavily doped region 118 to form an ohmic contact, an erase operation may be performed by direct tunneling of majority carriers, which compared with the traditional structure that performs GIDL erase, has the characteristics of fast erase speed and no temperature dependence. As shown in FIG. 1B, the first (source-side) select gate 110 applies an erase voltage to make the source-side select transistor be in an on-state. Therefore, majority carriers (i.e. electron holes) are generated that are directly tunneled to the columnar channel portion 108 to perform an erase operation.

In FIG. 1A, another insulating layer 124 may be disposed between the first select gate 110 and the columnar channel portion 108 and between the second select gate 112 and the columnar channel portion 108 to electrically isolate the columnar channel portion 108 from the select gates (110 and 112). In the present embodiment, since the columnar channel portion 108 does not need to be in direct contact with the substrate 100, the 3D NAND flash memory device 10 may be used in CuA architecture. That is, a drive circuit 126, such as a circuit such as CMOS, may further be disposed on the substrate 100 under the stacked structure 104, and a dielectric layer 128 covers the drive circuit 126, and a doped polysilicon layer or non-doped polysilicon layer used as the source line 102 may be disposed between the dielectric layer 128 and the first metal silicide layer 116. In addition, the columnar channel portion 108 in the present embodiment shows a solid pillar, but the invention is not limited thereto. In another embodiment, the columnar channel portion 108 may be a hollow pillar, and the hollow pillar may further include an insulating pillar (not shown) such as oxide therein, thus forming a structure similar to the concept of SOI (silicon-on-insulator).

Figure 1C:
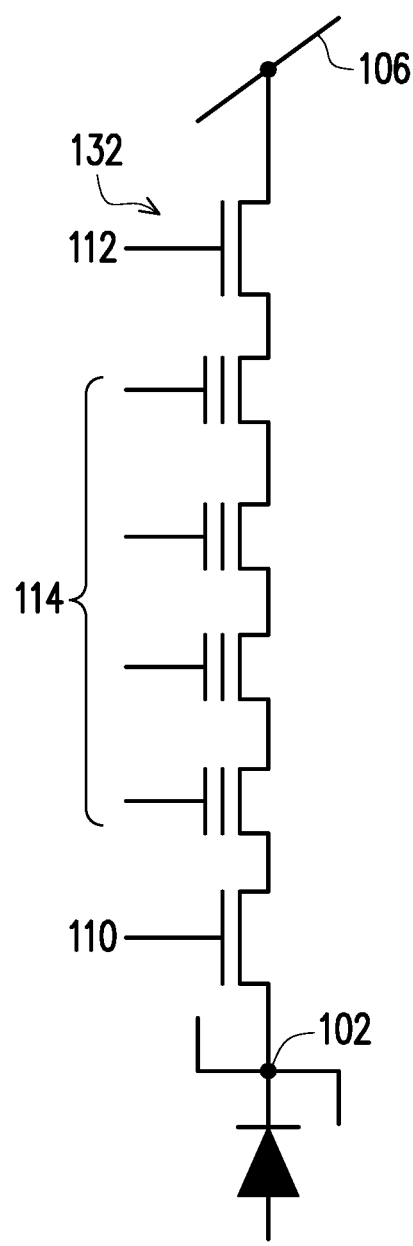
FIG. 1C is a simplified circuit diagram of a partial layout of the 3D NAND flash memory device of the first embodiment.

FIG. 1C is a simplified circuit diagram of a partial layout of the 3D NAND flash memory device of the first embodiment, wherein one NAND string 132 is shown, and the NAND string 132 includes a first select transistor containing the first select gate 110, a plurality of memory cells containing the plurality of control gates 114, and a second select transistor containing the second select gate 112 as shown in FIG. 1C. The NAND string 132 is disposed between the bit line 106 and the source line 102, and may perform an erase operation through direct tunneling.

Figure 2A:
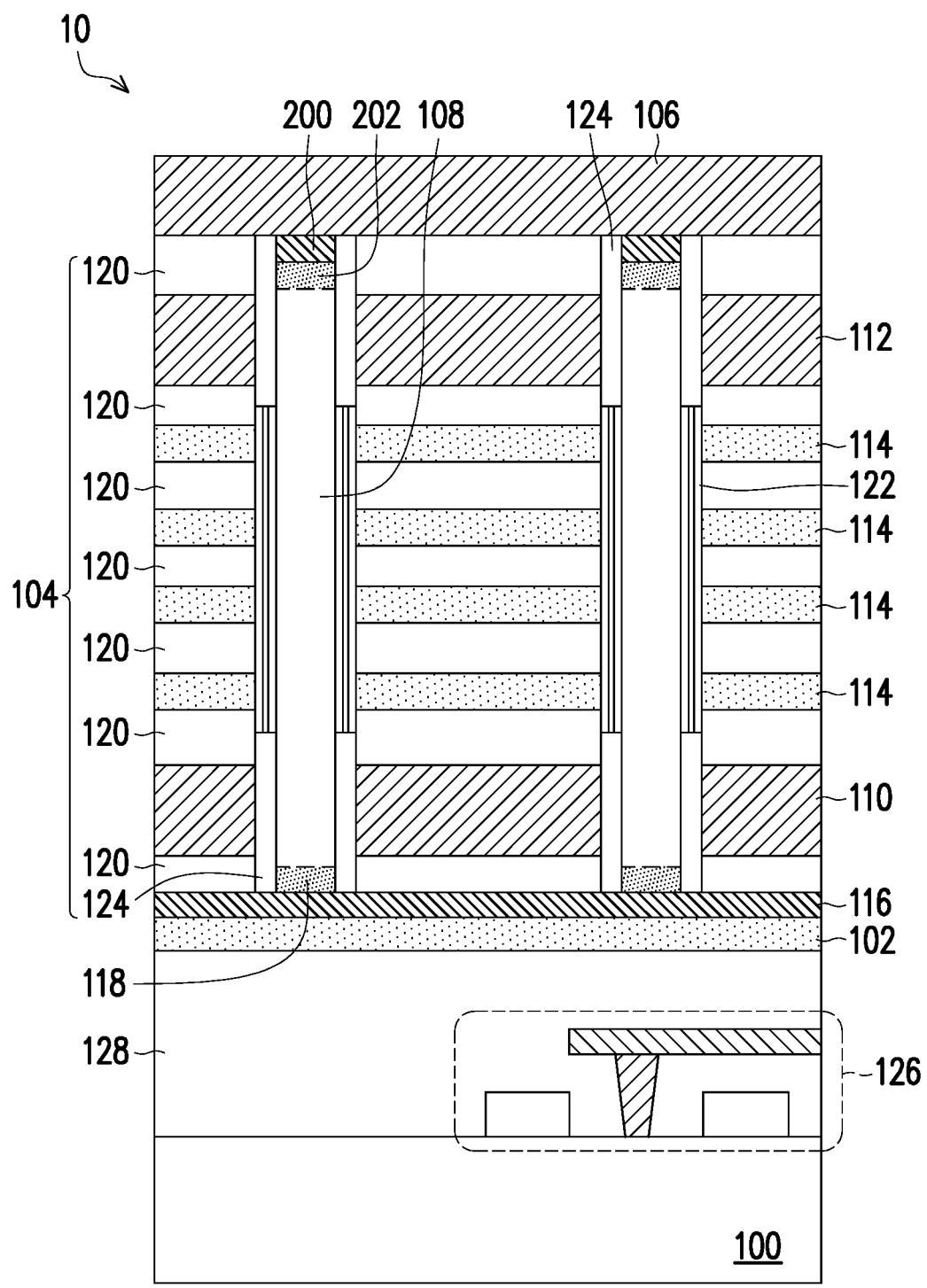
FIG. 2A is a diagram of a 3D NAND flash memory device according to the second embodiment of the invention.

FIG. 2A is a diagram of the 3D NAND flash memory device of the second embodiment of the invention, wherein the same reference numerals as those in the first embodiment are used to indicate the same or similar components, and the content of the same or similar components is also as provided in the content of the first embodiment and is not repeated herein.

Figure 2B:
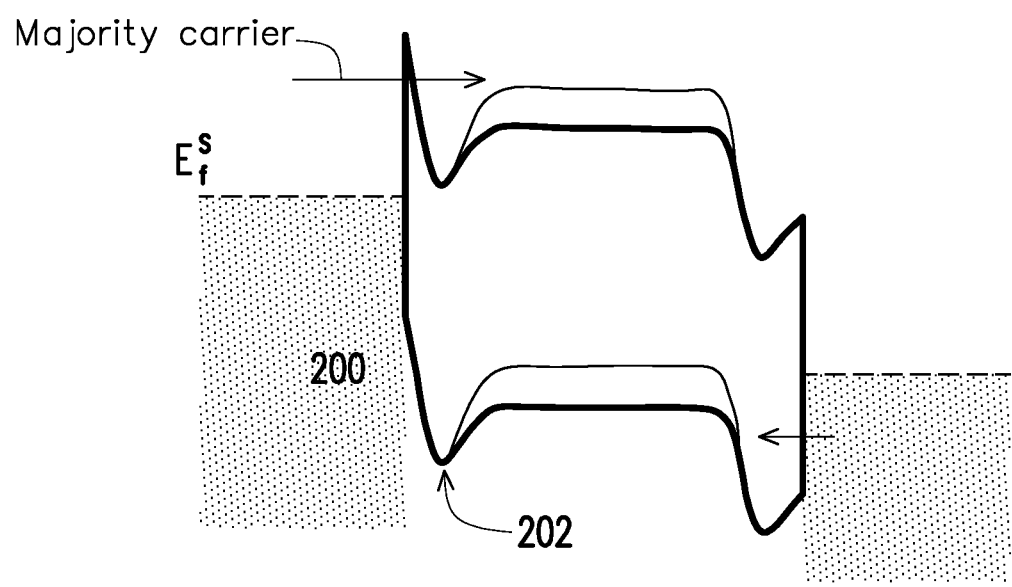
FIG. 2B is a diagram of conduction band and valence band waveforms of the MSB transistor of the 3D NAND flash memory device of the second embodiment performing a program operation.

Referring to FIG. 2, the difference between the present embodiment and the first embodiment is that the drain-side select transistor is also a modified Schottky barrier transistor containing the second (drain-side) select gate 112, a second metal silicide layer 200, and a second type heavily doped region (such as an n+ doped region) 202 disposed between the columnar channel portion 108 and the second metal silicide layer 200, wherein the material of the second metal silicide layer 200 is the same as the material of the first metal silicide layer 116. Since the drain-side select transistor has the second metal silicide layer 200 and the second type heavily doped region 202 to form an ohmic contact, a program operation may be performed by direct tunneling of majority carriers. As shown in FIG. 2B, the second select gate 112 applies a programmed voltage to make the drain-side select transistor be in the on-state. Therefore, majority carriers (i.e., electrons) are generated that are tunneled directly to the columnar channel portion 108 to perform a program operation. In addition, although "first", "second", etc. are used in the specification to describe different elements, regions, and layers, these elements, regions, and layers should not be limited by these terms. Instead, these terms are only used to distinguish an element, region, or layer from another element, region, or layer. Therefore, a drain-side select transistor may also be referred to as a first select transistor, and a source-side select transistor may also be referred to as a second select transistor, without departing from the teaching of the embodiments.

Figure 2C:
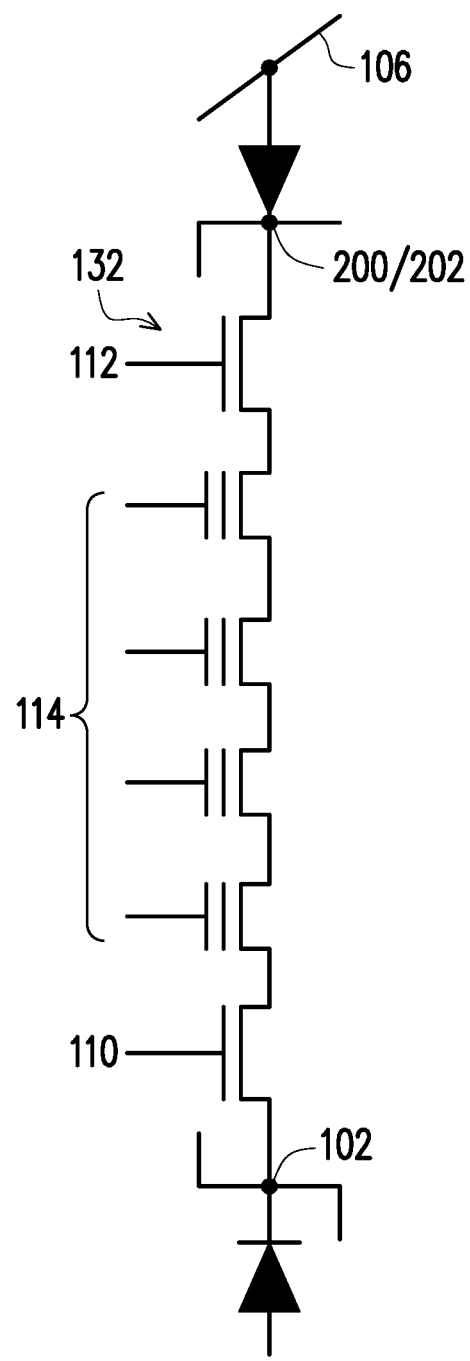
FIG. 2C is a simplified circuit diagram of a partial layout of the 3D NAND flash memory device of the second embodiment.

FIG. 2C is a simplified circuit diagram of a partial layout of the 3D NAND flash memory device of the second embodiment, wherein the NAND string 132 includes a first select transistor containing the first select gate 110, a plurality of memory cells containing the plurality of control gates 114, and a second select transistor containing the second select gate 112 as shown in FIG. 1C. Moreover, the NAND string 132 may not only perform the erase operation through direct tunneling, but also may perform a program operation through direct tunneling due to the arrangement of the second metal silicide layer 200 and the second type heavily doped region 202.

Based on the above, in the 3D NAND flash memory device of the above embodiments, since the source-side select transistor replaces the traditional MOS transistor with a modified Schottky barrier (MSB) transistor, an erase operation may be performed by direct tunneling of majority carriers, which is fast and consistent compared with the erase speed of GIDL and may be applied to the CuA design in which the drive circuit is placed under the NAND array. Moreover, the erase speed is not affected by temperature. In other embodiments, the modified MSB transistor is used as a drain-side select transistor, and is not limited to be used for an erase operation, and may also be used for a program operation. Moreover, if both the source-side select transistor and the drain-side select transistor adopt a modified MSB transistor, the program operation and the erase operation of the device may be achieved through direct tunneling of majority carriers.

Although the invention has been described with reference to the above embodiments, it will be apparent to one of ordinary skill in the art that modifications to the described embodiments may be made without departing from the spirit of the disclosure. Accordingly, the scope of the disclosure is defined by the attached claims not by the above detailed descriptions.

What is claimed is:

1. A three-dimensional (3D) NAND flash memory device, comprising:
   a substrate;
   a source line formed on the substrate;
   a stacked structure formed on the source line, wherein the stacked structure comprises a first select transistor, a plurality of memory cells, and a second select transistor, the first select transistor comprises a first select gate, the plurality of memory cells comprise a plurality of control gates, and the second select transistor comprises a second select gate;
   a bit line formed on the stacked structure; and
   at least one columnar channel portion extended axially from the source line and penetrating the stacked structure to be coupled to the bit line, and the first select gate is insulated from the columnar channel portion by a first insulating layer,
   wherein the first select transistor comprises a first metal silicide layer and a first type heavily doped region surrounded by the first insulating layer that is in direct contact with the first metal silicide layer so as to constitute a modified Schottky barrier (MSB) transistor, the first type heavily doped region is formed between the first metal silicide layer and the columnar channel portion and in direct contact with the first metal silicide layer and the columnar channel portion, and majority carriers of the first type heavily doped region are directly tunneling to the columnar channel portion when the first select transistor is in an on-state.

2. The 3D NAND flash memory device of claim 1, further comprising a drive circuit located on the substrate under the stacked structure.

3. The 3D NAND flash memory device of claim 1,
   wherein the first select transistor is a source-side select transistor, wherein the first metal silicide layer is formed on the source line and isolated from the first select gate by a second insulating layer; and
   the first type heavily doped region is directly in contact with the first metal silicide layer and the columnar channel portion.

4. The 3D NAND flash memory device of claim 1, wherein a material of the first metal silicide layer comprises nickel silicide ($NiSi_X$), cobalt silicide ($CoSi_X$), or titanium silicide ($TiSi_X$).

5. The 3D NAND flash memory device of claim 1, wherein a material of the first select gate and a material of the second select gate comprise a metal.

6. The 3D NAND flash memory device of claim 1, wherein a material of the plurality of control gates comprises polysilicon.

7. The 3D NAND flash memory device of claim 1, wherein a material of the columnar channel portion comprises n-doped polysilicon, p-doped polysilicon, or non-doped polysilicon.

8. The 3D NAND flash memory device of claim 1, wherein the columnar channel portion is a solid pillar or a hollow pillar.

9. The 3D NAND flash memory device of claim 8, wherein the hollow pillar further comprises an insulating pillar.

10. The 3D NAND flash memory device of claim 1, wherein the first select transistor is a drain-side select transistor, wherein
    the first metal silicide layer is formed on the bit line and isolated from the first select gate by a second insulating layer; and
    the first type heavily doped region is directly in contact with the first metal silicide layer and the columnar channel portion.

11. The 3D NAND flash memory device of claim 1, wherein the first type heavily doped region comprises an n+ doped region, and the majority carriers comprise electrons.

12. The 3D NAND flash memory device of claim 1, wherein the first type heavily doped region comprises a p+ doped region, and the majority carriers comprise electron holes.

13. The 3D NAND flash memory device of claim 1, wherein the second select transistor further comprises a second metal silicide layer and a second type heavily doped region formed between the second metal silicide layer and the columnar channel portion so as to constitute another modified Schottky barrier (MSB) transistor, and majority carriers of the second type heavily doped region are directly tunneling to the columnar channel portion when the second select transistor is in an on-state, wherein the second type heavily doped region is different from the first type heavily doped region.

* * * * *

UNITED STATES PATENT AND TRADEMARK OFFICE
CERTIFICATE OF CORRECTION

| | |
|---|---|
| PATENT NO. | : 11,552,093 B2 |
| APPLICATION NO. | : 16/952078 |
| DATED | : January 10, 2023 |
| INVENTOR(S) | : Zih-Song Wang |

It is certified that error appears in the above-identified patent and that said Letters Patent is hereby corrected as shown below:

On the Title Page

Item (30) Foreign Application Priority Data should read: Oct. 7, 2020 (TW) ................109134727

Signed and Sealed this
Twenty-eighth Day of March, 2023

*Katherine Kelly Vidal*

Katherine Kelly Vidal
*Director of the United States Patent and Trademark Office*